(12) United States Patent
Cho et al.

(10) Patent No.: US 8,866,128 B2
(45) Date of Patent: Oct. 21, 2014

(54) ORGANIC ELECTROLUMINESCENT DEVICE AND PREPARATION METHOD THEREOF

(75) Inventors: Hyun-Nam Cho, Gunpo-si (KR); Ji-Hoon Yoo, Bucheon-si (KR); Kwang-Choon Chung, Yongin-si (KR)

(73) Assignee: Inktec Co., Ltd. (KR)

( * ) Notice: Subject to any disclaimer, the term of this patent is extended or adjusted under 35 U.S.C. 154(b) by 816 days.

(21) Appl. No.: 12/377,433

(22) PCT Filed: Aug. 13, 2007

(86) PCT No.: PCT/KR2007/003869
§ 371 (c)(1),
(2), (4) Date: Jul. 23, 2010

(87) PCT Pub. No.: WO2008/020696
PCT Pub. Date: Feb. 21, 2008

(65) Prior Publication Data
US 2010/0289010 A1    Nov. 18, 2010

(30) Foreign Application Priority Data

Aug. 14, 2006 (KR) .......... 10-2006-0076814
Feb. 28, 2007 (KR) .......... 10-2007-0020377

(51) Int. Cl.
*H01L 35/24* (2006.01)
*H01L 51/50* (2006.01)
*H05B 33/22* (2006.01)
*H05B 33/14* (2006.01)

(52) U.S. Cl.
CPC .......... *H05B 33/14* (2013.01); *H01L 51/5036* (2013.01); *H05B 33/22* (2013.01); *H01L 51/5096* (2013.01)
USPC .................. 257/40; 257/E51.001

(58) Field of Classification Search
CPC .......... H01L 51/5044; H01L 51/0545; H01L 51/0541; H01L 51/0036; H01L 51/5012; B82Y 10/00
USPC .................. 257/98, 103; 313/503, 504, 506
See application file for complete search history.

(56) References Cited

U.S. PATENT DOCUMENTS

| 6,670,053 B2 | 12/2003 | Conley |
| 2003/0189401 A1 * | 10/2003 | Kido et al. .................. 313/504 |
| 2004/0041147 A1 | 3/2004 | Park |

(Continued)

FOREIGN PATENT DOCUMENTS

| CN | 1778147 | 5/2006 |
| EP | 1564825 | 8/2005 |

(Continued)

OTHER PUBLICATIONS

Chinese Office Action—CN Patent Application No. 200780034102.3 issued Jul. 5, 2010.

(Continued)

*Primary Examiner* — Anthony Ho
(74) *Attorney, Agent, or Firm* — Cantor Colburn LLP

(57) ABSTRACT

The present invention relates to a method capable of considerably improving the characteristics of an organic electroluminescent device. The present invention provides a method capable of reducing operating voltage and improving efficiency by inserting an inorganic oxide interlayer configured of at least one layer between light-emitting layers.

8 Claims, 5 Drawing Sheets

(56) References Cited

U.S. PATENT DOCUMENTS

| | | | |
|---|---|---|---|
| 2005/0134174 A1* | 6/2005 | Shiratori et al. | 313/506 |
| 2006/0147752 A1 | 7/2006 | Lee et al. | |
| 2006/0220538 A1* | 10/2006 | Kuma | 313/506 |

FOREIGN PATENT DOCUMENTS

| | | |
|---|---|---|
| EP | 1633169 | 3/2006 |
| JP | 10125463 | 5/1998 |
| JP | 2003272867 | 9/2003 |
| JP | 2005135706 | 5/2005 |
| JP | 2005251529 | 9/2005 |
| JP | 2006172763 | 6/2006 |
| JP | 2006173550 | 6/2006 |
| KR | 10-2005-0087213 | 8/2005 |
| KR | 10-2006-0011970 | 2/2006 |
| KR | 10-2006-0012120 | 2/2006 |
| KR | 10-2006-0071399 | 6/2006 |
| KR | 10-2006-0078358 | 7/2006 |
| KR | 10-2006-0084733 | 7/2006 |
| WO | WO 2004095892 A1 * | 11/2004 |
| WO | 2006013738 | 2/2006 |
| WO | 2006095892 | 9/2006 |

OTHER PUBLICATIONS

International Search Report—PCT/KR2007/003869 dated Nov. 20, 2007.

Korean Office Action—KR-10-2007-0020377 dated May 31, 2008.

European Search Report—PCT/KR2007/003869 dated Jul. 30, 2009.

Chinese Office Action—2007800341023 dated Dec. 25, 2009.

* cited by examiner

ORGANIC ELECTROLUMINESCENT DEVICE AND PREPARATION METHOD THEREOF

TECHNICAL FIELD

The present invention relates to an organic electroluminescent device or an organic light emitting diode (OLED), and more specifically to an organic electroluminescent device or an organic light emitting diode capable of lowering operating voltage and improving efficiency by inserting an inorganic oxide interlayer configured of at least one layer between light-emitting layers.

BACKGROUND ART

An OLED is a self-emissive device using a phenomenon generating light itself by combining electron and hole in a light-emitting layer if current is applied to a device including a fluorescent light-emitting layer or a phosphor light-emitting layer between its cathode and anode. The OLED is simple in a structure and a manufacturing process as well as can implement high definition image and wide viewing angle. Also, the OLED can completely implement moving picture and high color purity and has features suitable for portable electronic equipment due to low power consumption and low voltage operation.

The OLED has a multi-layer structure without using only the light-emitting layer between two electrodes in order to improve efficiency and lower operation voltage associated with the lifetime of a current device. The OLED generally has a multi-layer structure such as, for example, a hole injection and transfer layer, an electron injection and transfer layer, and a hole blocking layer, etc. The OLED forms exciton by recombining the electron and the hole injected from each of the cathode and anode in the light-emitting layer and uses light generated by the exciton energy loss. In the device, the thickness of each layer formed of organic matter is generally about 100 nm, high brightness light-emitting can be made under low voltage below 10V, and since the self-emission of fluorescence or phosphorescence is used, a rapid response speed for an input signal can be obtained.

In order to operate the OLED at low operating voltage, an energy barrier between the electrode and the organic matter should be lowered. In order to increase light-emitting efficiency, many electrons-holes should equally be injected in an applied voltage and the recombination probability thereof should be increased. In the case of the organic matter, high voltage is applied so that an organic light-emitting layer with weak molecular structure is damaged due to high energy, thereby deteriorating device's characteristic and lifetime. Therefore, it is very important to be able to inject a sufficient number of holes and electrons at low voltage.

Generally, in the case of the organic matter used in the light-emitting layer, the characteristics are deteriorated by holes. In order to prevent this phenomenon, the insertion of the hole blocking layer and/or the electron blocking layer has been used. An OLED comprising a layer formed of organic compounds containing 3-phenylindolyl group between the hole transfer layer and the light-emitting layer is disclosed in U.S. Pat. No. 6,670,053, the content introducing inorganic matter layer, such as Se, Te, ZnSe, etc., between the light-emitting layer and the hole blocking layer is disclosed in K.R. Patent No. 2006-0012120, and the content inserting an organic layer of LiF, NaF, etc. between a hole injection layer and a hole transfer layer is disclosed in K.R. Patent No. 2006-0078358. However, it is hard to find an example introducing an inorganic matter layer into the inside of the light-emitting layer. Furthermore, there has been a limitation in obtaining satisfactory efficiency and lifetime in the case of a conventional OLED structure using an organic matter intermediate layer formed.

Therefore, the present invention is the outcome of continuous study in order to solve several problems of the OLED. In other words, the present invention provides a method capable of considerably lowering the operating voltage and efficiency of OLED by a simple method of forming the inorganic oxide interlayer configured of at least one layer between the light-emitting layers, and in particular has the features capable of easily applying the method to an existing deposition process as well as a solution process suitable for a large size OLED.

DISCLOSURE

Technical Problem

An object of the present invention provides a long-lifetime OLED structure by forming an inorganic oxide interlayer configured of at least one layer between light-emitting layers to increase the recombination probability of electrons-holes injected from its cathode and anode in the light-emitting layers so that the operating voltage of the OLED device is lowered and the efficiency thereof is improved, in order to improve the conventional OLED device characteristics.

Technical Solution

In order to accomplish the object of the present invention, a method of manufacturing an OLED device by forming an inorganic oxide interlayer between light-emitting layers is not particularly limited if conformed to the features of the present invention, but can selectively use, for example, any one of a spin coating, a roll coating, a spray coating, a dip coating, a flow coating, a doctor blade and dispensing, an inkjet printing, an offset printing, a screen printing, a pad printing, a gravure printing, a flexography printing, a stencil printing, an imprinting, a xerography, a lithography, a heat deposition, an electron beam deposition, an ion beam deposition, a sputtering method, etc.

A method of forming an OLED device structure of the present invention can use the existing device forming method as it is, except for forming the inorganic oxide interlayer configured of at least one layer between only light-emitting layers.

Hereinafter, one example of the present invention will be below described in more detail with reference to the accompanying drawings.

In other words, as shown in FIG. 1, an OLED according to the present invention is manufactured by coating an ITO anode electrode 10 on a glass substrate or a plastic substrate and sequentially stacking a hole injection layer 20, a first light-emitting layer 31, an inorganic oxide interlayer 41, a second light-emitting layer 32, a hole blocking layer 50, and a cathode electrode 60 on the substrate. Meanwhile, light-emitting materials used for the first light-emitting layer 31 and the second light-emitting layer 32 include red, green, blue, yellow, white, etc., but is not particularly thereto. The emitting materials of the first and second light-emitting layers may be the same or different. For example, when the first light-emitting layer is a blue light-emitting layer, the second light-emitting layer may be a blue light-emitting layer or a green and/or red light-emitting layer, and vice versa. Irrespective of a light-emitting form, the first light-emitting layer and/or the second light-emitting layer can use fluorescence or phosphorescence form, respectively, or a combination form thereof. Also, in the case of using host and dopant irrespective of colors, they are separated so that they can be used in the first light-emitting layer and/or the second light-emitting layer. If needed, as shown in FIG. 2, the OLED device can be manufactured using inorganic oxide interlayers 42 and 43 configured of at least two layers and at least one kind of light-emitting material. The constitution of forming the plurality of inorganic oxide interlayers in the light-emitting layers is not limited to only two layers as shown in FIG. 2, but can be adopted in various forms.

The feature of the present invention is the formation the inorganic oxide interlayer between the light-emitting layers in the process described with reference to FIGS. 1 and 2, but is not limited thereto. It is considered that the inorganic oxide of the present invention forms a net structure by reacting on a surface of light-emitting organic matter under proper conditions. If the inorganic oxide forms well arranged net structure on the organic matter, the characteristics are maximized. The inorganic oxide interlayer serves to maintain constant movement speed of electron and hole to make the mobility of electron and hole in a recombination region slow so that the density of electron and hole becomes high and the recombination probability is increased.

The inorganic oxide interlayer materials of the OLED according to the present invention includes oxide, such as, for example, Zr, Li, Na, K, Rb, Cs, Be, Mg, Ca, Sr, Ba, Ti, V, Mn, Fe, Co, Ni, Cu, Zn, Y, Nb, Mo, Ru, Rh, Pd, Ag, Cd, Hf, Ta, W, Re, Os, Ir, Pt, Au, Hg, Al, Ga, In, Tl, Ge, Sn, Pb, Sb, Bi, Si, As, Se, Eu, Sm, Th, Ac, Ce, Pr, and the like or at least one selected from complex oxide consisting of at least two of the elements. As a concrete example, there are single-element oxide such as $ZrO_2$, $Li_2O$, $Na_2O$, $RbO_2$, $BeO$, $CaO$, $SrO$, $BaO$, $SiO_2$, $TiO$, $Ti_2O_3$, $TiO_2$, $V_2O_3$, $V_2O_4$, $V_2O_5$, $Mn_3O_4$, $MnO$, $Mn_2O_3$, $MnO_2$, $FeO$, $Fe_3O_4$, $ZnO$, $ZnO_2MgO$, $SnO_2$, $In_2O_3$, $CrO_3$, $CuO$, $Cu_2O$, $HfO_2$, $Fe_2O_3$, $CoO$, $CO_3O_4$, $NiO$, $NiO_2$, $CeO_2$, $Y_2O_3$, $NbO$, $NbO_2$, $Nb_2O_5$, $MoO_2$, $MoO_3$, $RuO_2$, $Rh_2O_3$, $RhO_2$, $PdO$, $AgO$, $Ag_2O$, $CdO$, $Ta_2O_5$, $WO_3$, $WO_2$, $ReO_3$, $OsO_4$, $IrO_2$, $PtO_2$, $Au_2O_3$, $HgO$, $Ga_2O_3$, $GeO_2$, $SnO$, $PbO_2$, $PbO$, $PbO_4$, $Sb_2O_3$, $Sb_2O_4$, $Bi_2O_5$, $Bi_2O_3$, $As_2O_3$, $As_2O_5$, $SeO_2$, $Eu_2O_3$. However, if conformed to the features of the present invention, the complex oxide such as $ZrSiO_4$, $RbTiO_3$, $RbSeO_3$, $FeLiO_2$, $FeMoO_4$, $FeO_3Ti$, $Fe_2O_4Zn$, $Fe_2O_5Ti$, $Fe_5O_{12}Y_3$, $Fe_{12}O_{16}Sr$, $NiFeO_4$, $Nb_2O_6Pb$, $NbO_6Zn$, $MoO_4Pb$, $MoO_4Sr$, $MoO_4Zn$, $AgOV$, $AgO_4Re$, $Ag_2CrO_4$, $Ag_2O$, $Ag_2O_4W$, $CdO_3Zr$, $Ga_5Gd_3O_{12}$, $TiReO_4$, $PbSeO_3$, $PbTiO_3$, $PbZrO_3$, $Bi_2O_7Ti_2$, $Ce_2O_{12}W_3$ may be also used. The inorganic oxide according to the present invention may be the mixture of the single-element oxide and the complex oxide. Also, in the preferred embodiment of the present invention, the inorganic oxide may be oxide of Zr, Si, Al, Ti or Zn or at least one selected from at least two complex oxide of the elements.

Also, the materials of the inorganic oxide interlayer according to the present invention can be used irrespective of form, state, size, shape, etc. In other words, if conformed to the features of the present invention, any form such as solution, sol, colloid, or solid particle state, etc., can be used and after the physical or chemical process such as heat processing, acid processing, base processing, even precursor capable of forming the inorganic oxide interlayer can be used.

When forming the inorganic oxide interlayer by means of the solution process, it is preferable that solvent not damaging the light-emitting organic matter layer is used. For example, when the solvent used in the light-emitting forming solution is organic solvent, it is preferable to use the solvent of inorganic oxide dispersed in organic solvent not damaging the light-emitting layer or to use water-based or alcohol-based solvent. As a concrete example, if the light-emitting material uses polar organic solvent such as chloroform or tetrahydrofuran, the solvent of inorganic oxide interlayer solution preferably use oil type solvent which is non-polar solvent such as hexane or heptane, alcohol type solvent such as ethanol, butanol, or water-based solvent using water as main component.

It does not need to limit the thickness or position of the inorganic oxide interlayer, but its thickness is 0.1 nm to 500 nm, preferably 1 nm to 100 nm, more preferably 2 nm to 50 nm. However, if the thickness of inorganic matter intermediate layer is too thin or thick, it has a problem that the operating voltage is raised or the light-emitting efficiency is reduced. And, if conformed to the features of the present invention, its position is not limited, wherever it is placed in light-emitting layer.

The content of the inorganic oxide solution used in the solution process is particularly not limited. However, the range of weight ratio for the entire composition is 0.01 to 10%, more preferably 0.1 to 5%.

The method of manufacturing the inorganic oxide interlayer will be described with reference to a spin coating method as an example. After the hole injection layer of 40 nm in thickness is formed on the anode electrode by spin-coating PEDOT/PSS (Baytron P 4083 available from Bayer Co.; Poly (3,4-ethylenedioxythiophene)/Poly(styrene sulfonic acid)) aqueous solution and the organic light-emitting layer is spin-coated thereon at a thickness of 40 nm, the inorganic oxide solution drops on the organic light-emitting layer and is then coated for 20 seconds at 600 rpm. Then, the inorganic oxide intermediate layer is formed by raising the rpm to 2000 and performing the spin coating for 1 minute. Thereafter, the organic light-emitting layer is spin-coated on the inorganic oxide layer at a thickness of 40 nm and the hole blocking layer is spin-coated and the anode electrode is then deposited thereon by means of a evaporator, so that the device can be manufactured. The dry condition of the inorganic oxide intermediate layer is at 150° C. for thirty minutes to one hour, preferably at 170° C. for thirty minutes to one hour, but is not limited thereto.

The method of manufacturing the inorganic oxide interlayer will be described with reference to an ink jet method as an example. The PEDOT/PSS (hole injection material available from Bayer Co.) aqueous solution on the anode electrode is discharged by means of a spectra SX-128 head to form the hole injection layer of 40 nm in thickness and sequentially stacks the light-emitting layer, the inorganic oxide interlayer, the hole blocking layer thereon by means of the ink jet method and then, the cathode electrode is deposited by means of a evaporator so that the device can be manufactured. Also, a roll to roll coating method such as gravure, flexography, and offset can be used.

As the method of manufacturing the OLED by forming the inorganic oxide interlayer between the light-emitting layers, any known methods can be used if the completed OLED structure is conformed to the present invention.

DESCRIPTION OF DRAWINGS

The above and other objects, features and advantages of the present invention will become apparent from the following description of preferred embodiments given in conjunction with the accompanying drawings, in which.

DETAILED DESCRIPTION OF MAIN ELEMENTS

Figure 1:
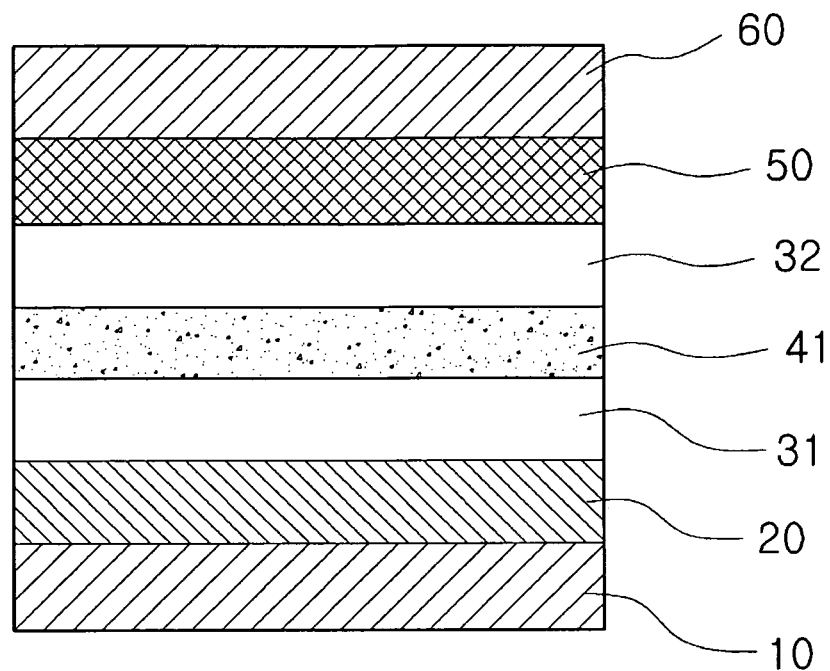
FIG. 1 is a view showing a structure of an organic electroluminescent device using one inorganic oxide interlayer according to the present invention as one example.
Figure 2:
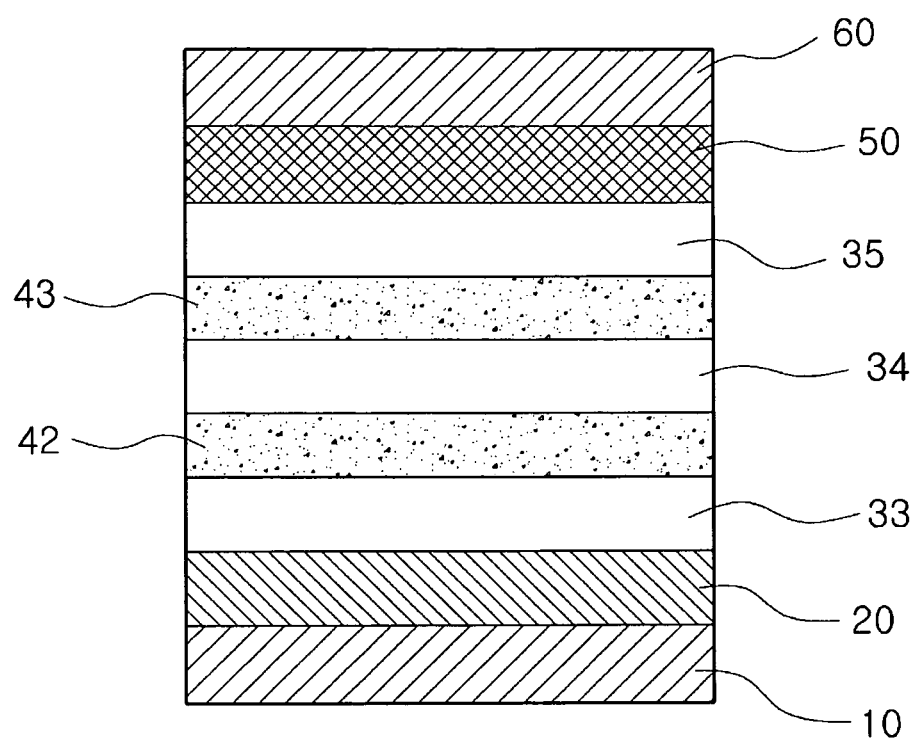
FIG. 2 is a view showing a structure of an organic electroluminescent device using two inorganic oxide interlayers according to the present invention as one example.

10: anode electrode
20: hole injection layer
31, 32, 33, 34, 35: light-emitting layer
41, 42, 43: inorganic oxide interlayer
50: hole blocking injection layer
60: cathode electrode

BEST MODE

Hereinafter, the examples of the present invention will be described in detail with reference to accompanying drawings. However, the following examples are only for the understanding of the present invention and the present invention is not limited to or by them.

Example 1

A 15 $\Omega/cm^2$ (120 nm) ITO glass substrate as an anode electrode is cut at a proper size and is cleaned in isopropyl alcohol and pure water by means of ultrasonic wave for 10 minutes and is cleaned by means of UV or ozone for 20 minutes. A PEDOT/PSS (product available from Bayer Co.; Poly(3,4-ethylenedioxythiophene)/Poly(styrene sulfonic acid)) aqueous solution is spin-coated on the upper of the substrate to form a hole injection layer of 40 nm in thickness. Then, a light-emitting layer of 40 nm in thickness is formed on the hole injection layer by spin-coating the mixture of the 95:5 weight percent of PVK (Poly(9-vinylcarbazole) available form Aldrich Co.) and Flrpic (Iridium(III) bis[(4,6-difluorophenyl)pyridinato-N,$C^{2'}$]picolinate), which is blue phosphor light-emitting material, and a zirconium oxide intermediate layer of 10 nm in thickness is then formed on the upper of the light-emitting layer by spin-coating zirconium oxide solution dissolved with D40 (product form EXXON Co.) solvent. Thereafter, the light-emitting layer of 40 nm in thickness is formed on the zirconium oxide intermediate layer by spin-coating the mixture of the 95:5 weight percent of the PVK, which is the which is blue phosphor light-emitting material, and the Flrpic again. Then, BAlq (Aluminum(III) bis(2-methyl-8-quinolinato)-4-phenylphenolato) is deposited on the upper of the light-emitting layer at a thickness of 30 nm and the cathode electrode is then deposited at a thickness of LiF 1 nm, Al 100 nm so that the OLED is manufactured. The evaluation results of the operating voltage and efficiency characteristics of the manufactured OLED are listed in a table 1.

Example 2

A 15 $\Omega/cm^2$ (120 nm) ITO glass substrate as an anode electrode is cut at a proper size and is cleaned in isopropyl alcohol and pure water by means of ultrasonic wave for 10 minutes and is cleaned by means of UV or ozone for 20 minutes. A PEDOT/PSS (hole injection material which is product from Bayer Co.) aqueous solution is spin-coated on the upper of the substrate to form a hole injection layer of 40 nm in thickness. Then, a light-emitting layer of 40 nm in thickness is formed on the hole injection layer by spin-coating the mixture of the 95:5 weight percent of PVK and Ir(ppy)$_3$ (fac-tris(2-phenylpyridinato)iridium), which is green phosphor light-emitting material, and a zirconium oxide intermediate layer of 10 nm in thickness is then formed on the upper of the light-emitting layer by spin-coating zirconium oxide solution dissolved with D40 (product form EXXON Co.) solvent. Thereafter, the light-emitting layer of 40 nm in thickness is formed on the zirconium oxide intermediate layer by spin-coating the mixture of 95:5 weight percent of the PVK and the Ir(ppy)$_3$ again, which is green phosphor light-emitting material. Then, BAlq is deposited on the upper of the light-emitting layer at a thickness of 30 nm and the cathode electrode is then deposited at a thickness of LiF 1 nm, Al 100 nm so that the OLED is manufactured. The evaluation results of the operating voltage and efficiency characteristics of the manufactured OLED are listed in a table 1.

Example 3

A 15 $\Omega/cm^2$ (120 nm) ITO glass substrate as an anode electrode is cut at a proper size and is cleaned in isopropyl alcohol and pure water by means of ultrasonic wave for 10 minutes and is cleaned by means of UV or ozone for 20 minutes. A PEDOT/PSS aqueous solution is spin-coated on the upper of the substrate to form a hole injection layer of 40 nm in thickness. Then, a light-emitting layer of 40 nm in thickness is formed on the hole injection layer by spin-coating the mixture of the 95:5 weight percent of PVK and Btp$_2$Ir (acac)(Iridium(III) bis(2-(2'-benzothienyl)pyridinato-N,$C^{3'}$) (acetylacetonate), which is red phosphor light-emitting material, and a zirconium oxide intermediate layer of 10 nm in thickness is then formed on the upper of the light-emitting layer by spin-coating zirconium oxide solution dissolved with D40 (product form EXXON Co.) solvent. Thereafter, the light-emitting layer of 40 nm in thickness is formed on the zirconium oxide intermediate layer by spin-coating the mixture of 95:5 weight percent of the PVK and the Btp$_2$Ir(acac) again, which is red phosphor light-emitting material. Then, BAlq is deposited on the upper of the light-emitting layer at a thickness of 30 nm and the cathode electrode is then deposited at a thickness of LiF 1 nm, Al 100 nm so that the OLED is manufactured. The evaluation results of the operating voltage and efficiency characteristics of the manufactured OLED are listed in a table 1.

Example 4

An example 4 is the same as the example 3 in the method of manufacturing the OLED, excepting that silicon dioxide as the intermediate layer is used. The evaluation results of the operating voltage and efficiency characteristics of the manufactured OLED are listed in a table 1.

Example 5

An example 5 is the same as the example 3 in the method of manufacturing the OLED, excepting that aluminum oxide as the intermediate layer is used. The evaluation results of the operating voltage and efficiency characteristics of the manufactured OLED are listed in a table 1.

Example 6

An example 6 is the same as the example 3 in the method of manufacturing the OLED, excepting that titanium oxide as the intermediate layer is used. The evaluation results of the operating voltage and efficiency characteristics of the manufactured OLED are listed in a table 1.

Example 7

An example 7 is the same as the example 3 in the method of manufacturing the OLED, excepting that zinc oxide as the intermediate layer is used. The evaluation results of the operating voltage and efficiency characteristics of the manufactured OLED are listed in a table 1.

Example 8

An example 8 is the same as the example 3 in the method of manufacturing the OLED, excepting that zirconium silicate as the intermediate layer is used. The evaluation results of the operating voltage and efficiency characteristics of the manufactured OLED are listed in a table 1.

Example 9

A 15 $\Omega/cm^2$ (120 nm) ITO glass substrate as an anode electrode is cut at a proper size and is cleaned in isopropyl alcohol and pure water by means of ultrasonic wave for 10 minutes and is cleaned by means of UV or ozone for 20 minutes. A PEDOT/PSS (hole injection material which is product from Bayer Co.) aqueous solution is spin-coated on the upper of the substrate to form a hole injection layer of 40 nm in thickness. Then, a light-emitting layer of 40 nm in thickness is formed on the hole injection layer by spin-coating the mixture of the 95:5 weight percent of PVK and Flrpic, which is blue phosphor light-emitting material, and a zirconium oxide intermediate layer of 10 nm in thickness is then formed on the upper of the light-emitting layer by spin-coating zirconium oxide solution dissolved with D40 (product form EXXON Co.) solvent. Thereafter, the light-emitting layer of 40 nm in thickness is formed on the zirconium oxide intermediate layer by spin-coating the mixture of 95:5 weight percent of the PVK and the $Btp_2Ir(acac)$ again, which is red phosphor light-emitting material. Then, BAlq is deposited on the upper of the light-emitting layer at a thickness of 30 nm and the cathode electrode is then deposited at a thickness of LiF 1 nm, Al 100 nm so that the OLED is manufactured. The evaluation results of the operating voltage and efficiency characteristics of the manufactured OLED are listed in a table 1.

Example 10

The ITO electrode is formed on the glass substrate and 2-TNATA(4,4',4"-tris(N-(1-naphthyl)-N-phenylamino) triphenylamine), which is the hole injection layer, is then deposited thereon at a thickness of 350 Å by means of the vacuum evaporator and NPD (N,N'-di(1-naphthyl)-N,N'-diphenylbenzidine), which is the hole injection layer, is then deposited at a thickness of 150 Å. Thereafter, DPVBi(1,4-bis (2,2-diphenylvinyl)biphenyl), which is the light-emitting layer, is deposited at a thickness of 175 Å and zirconium oxide is then deposited at a thickness of 50 Å by using an E-beam evaporator and the DPVBi, which is the light-emitting layer, is sequentially deposited again at a thickness of 175 Å, Alq3 50 Å, LiF 10 Å, Al 2000 Å, so that the OLED is manufactured. The evaluation results of the operating voltage and efficiency characteristics of the manufactured OLED are listed in a table 1.

Example 11

An example 11 is the same as the example 10 in the method of manufacturing the OLED, excepting that titanium oxide as the intermediate layer is used. The evaluation results of the operating voltage and efficiency characteristics of the manufactured OLED are listed in a table 1.

Example 12

A 15 $\Omega/cm^2$ (120 nm) ITO glass substrate as an anode electrode is cut at a proper size and is cleaned in isopropyl alcohol and pure water by means of ultrasonic wave for 10 minutes and is cleaned by means of UV or ozone for 20 minutes. A PEDOT/PSS (hole injection material which is product from Bayer Co.) aqueous solution is spin-coated on the upper of the substrate to form a hole injection layer of 40 nm in thickness. Then, a light-emitting layer of 27 nm in thickness is formed on the hole injection layer by spin-coating the mixture of the 95:5 weight percent of PVK and Ir(ppy)$_3$, which is green phosphor light-emitting material, and a zirconium oxide intermediate layer of 5 nm in thickness is then formed on the upper of the light-emitting layer by spin-coating zirconium oxide solution dissolved with D40 (product form EXXON Co.) solvent. Thereafter, the light-emitting layer of 27 nm in thickness is formed on the zirconium oxide intermediate layer by spin-coating the mixture of 95:5 weight percent of the PVK and the Ir(ppy)$_3$ again, which is the which is green phosphor light-emitting material, and a zirconium oxide intermediate layer of 5 nm in thickness is then formed on the upper of the light-emitting layer by spin-coating zirconium oxide solution dissolved with D40 (product form EXXON Co.) solvent. Next, the light-emitting layer of 27 nm in thickness is formed on the zirconium oxide intermediate layer by spin-coating the mixture of 95:5 weight percent of the PVK and the Ir(ppy)$_3$ again, which is the which is green phosphor light-emitting material. Then, BAlq is deposited on the upper of the light-emitting layer at a thickness of 30 nm and the cathode electrode is then deposited at a thickness of LiF 1 nm, Al 100 nm so that the OLED is manufactured. The evaluation results of the operating voltage and efficiency characteristics of the manufactured OLED are listed in a table 1.

Example 13

An example 13 is the same as the example 1 in the method of manufacturing the OLED, excepting that the zirconium intermediate layer using zirconium oxide solution is formed by means of the ink jet method using the spectra SX-128 head. The evaluation results of the operating voltage and efficiency characteristics of the manufactured OLED are listed in a table 1.

Example 14

An example 14 is the same as the example 3 in the method of manufacturing the OLED, excepting that the zirconium oxide intermediate layer of 40 nm in thickness is used. The evaluation results of the operating voltage and efficiency characteristics of the manufactured OLED are listed in a table 1.

Example 15

An example 15 is the same as the example 3 in the method of manufacturing the OLED, excepting that the mixture of 99:1 weight percent ratio of zirconium oxide and titanium oxide as the intermediate layer is used. The evaluation results of the operating voltage and efficiency characteristics of the manufactured OLED are listed in a table 1.

Comparative Example 1

A 15 $\Omega/cm^2$ (120 nm) ITO glass substrate as an anode electrode is cut at a proper size and is cleaned in isopropyl alcohol and pure water by means of ultrasonic wave for 10 minutes and is cleaned by means of UV or ozone for 20 minutes. A PEDOT/PSS (hole injection material, which is product from Bayer Co.) aqueous solution is spin-coated on the upper of the substrate to form a hole injection layer of 40 nm in thickness. Then, a light-emitting layer of 80 nm in thickness is formed on the hole injection layer by spin-coating the mixture of the 95:5 weight percent of PVK and Flrpic, which is blue phosphor light-emitting material. Then, BAlq is deposited on the upper of the light-emitting layer at a thickness of 30 nm and the cathode electrode is then deposited at a thickness of LiF 1 nm, Al 100 nm so that the OLED is manufactured. The evaluation results of the operating voltage and efficiency characteristics of the manufactured OLED are listed in a table 1.

Comparative Example 2

A 15 $\Omega/cm^2$ (120 nm) ITO glass substrate as an anode electrode is cut at a proper size and is cleaned in isopropyl alcohol and pure water by means of ultrasonic wave for 10 minutes and is cleaned by means of UV or ozone for 20 minutes. A PEDOT/PSS (hole injection material, which is product from Bayer Co.) aqueous solution is spin-coated on the upper of the substrate to form a hole injection layer of 40 nm in thickness. Then, a light-emitting layer of 80 nm in thickness is formed on the hole injection layer by spin-coating the mixture of the 95:5 weight percent of PVK and Ir(ppy)$_3$, which is green phosphor light-emitting material. Then, BAlq is deposited on the upper of the light-emitting layer at a thickness of 30 nm and the cathode electrode is then deposited at a thickness of LiF 1 nm, Al 100 nm so that the OLED is manufactured. The evaluation results of the operating voltage and efficiency characteristics of the manufactured OLED are listed in a table 1.

Comparative Example 3

A 15 $\Omega/cm^2$ (120 nm) ITO glass substrate as an anode electrode is cut at a proper size and is cleaned in isopropyl alcohol and pure water by means of ultrasonic wave for 10 minutes and is cleaned by means of UV or ozone for 20 minutes. A PEDOT/PSS (hole injection material, which is product from Bayer Co.) aqueous solution is spin-coated on the upper of the substrate to form a hole injection layer of 40 nm in thickness. Then, a light-emitting layer of 80 nm in thickness is formed on the hole injection layer by spin-coating the mixture of the 95:5 weight percent of PVK and Btp$_2$Ir (acac), which is red phosphor light-emitting material. Then, BAlq is deposited on the upper of the light-emitting layer at a thickness of 30 nm and the cathode electrode is then deposited at a thickness of LiF 1 nm, Al 100 nm so that the OLED is manufactured. The evaluation results of the operating voltage and efficiency characteristics of the manufactured OLED are listed in a table 1.

Comparative Example 4

A 15 $\Omega/cm^2$ (120 nm) ITO glass substrate as an anode electrode is cut at a proper size and is cleaned in isopropyl alcohol and pure water by means of ultrasonic wave for 10 minutes and is cleaned by means of UV or ozone for 20 minutes. A PEDOT/PSS (hole injection material, which is product from Bayer Co.) aqueous solution is spin-coated on the upper of the substrate to form a hole injection layer of 40 nm in thickness. Then, a light-emitting layer of 40 nm in thickness is formed on the hole injection layer by spin-coating the mixture of the 95:5 weight percent of PVK and Flrpic, which is blue phosphor light-emitting material, and a light-emitting layer of 40 nm in thickness is formed on the hole injection layer by spin-coating the mixture of the 95:5 weight percent of PVK and Btp$_2$Ir(acac), which is red phosphor light-emitting material. Then, BAlq is deposited on the upper of the light-emitting layer at a thickness of 30 nm and the cathode electrode is then deposited at a thickness of LiF 1 nm, Al 100 nm so that the OLED is manufactured. The evaluation results of the operating voltage and efficiency characteristics of the manufactured OLED are listed in a table 1.

Comparative Example 5

The ITO electrode is formed on the glass substrate and 2-TNATA, which is the hole injection layer, is then deposited thereon at a thickness of 15 nm by means of the vacuum evaporator and NPD, which is the hole injection layer, is then deposited at a thickness of 35 nm. Thereafter, DPVBi, which is the light-emitting layer, is deposited at a thickness of 35 nm and is sequentially deposited again at a thickness of Alq3 5 nm, LiF 1 nm, Al 200 nm, so that the OLED is manufactured. The evaluation results of the operating voltage and efficiency characteristics of the manufactured OLED are listed in a table 1.

The efficiency of the OLED manufactured by the examples 1 to 15 and the comparative examples 1 to 5 measured by means of Keithley 2400, which is an I-V-L measuring apparatus is listed in table 1.

Evaluation results for physical property of OLED

TABLE 1

| | Current Density (mA/cm$^2$) | Voltage (V) | Brightness (cd/m$^2$) | Efficiency (cd/A) | Efficiency (lm/W) |
|---|---|---|---|---|---|
| example 1 | 0.92 | 7.0 | 23.64 | 2.57 | 1.15 |
| comparative example 1 | 5.04 | 11.0 | 90.07 | 1.79 | 0.51 |
| example 2 | 0.24 | 7.0 | 66.2 | 27.58 | 12.37 |

TABLE 1-continued

| | Current Density (mA/cm²) | Voltage (V) | Brightness (cd/m²) | Efficiency (cd/A) | Efficiency (lm/W) |
|---|---|---|---|---|---|
| comparative example 2 | 0.02 | 6.5 | 1.75 | 8.75 | 4.23 |
| example 3 | 29.90 | 12.0 | 44.17 | 0.15 | 0.04 |
| example 4 | 0.49 | 8.0 | 9.07 | 1.87 | 0.73 |
| example 5 | 0.81 | 8.0 | 15.92 | 1.96 | 0.77 |
| example 6 | 0.62 | 8.00 | 4.62 | 0.74 | 0.29 |
| example 7 | 0.04 | 8.10 | 0.76 | 1.79 | 0.70 |
| example 8 | 0.46 | 8.0 | 10.90 | 2.37 | 0.93 |
| comparative example 3 | 0.88 | 11.0 | 0.87 | 0.10 | 0.03 |
| example 9 | 0.07 | 6.0 | 2.13 | 2.96 | 0.22 |
| comparative example 4 | 0.14 | 6.1 | 3.31 | 2.36 | 0.03 |
| example 10 | 10.00 | 6.4 | 157 | 1.57 | 0.77 |
| example 11 | 25.00 | 7.4 | 397 | 1.59 | 0.67 |
| comparative example 5 | 25.00 | 8.5 | 207 | 0.83 | 0.31 |
| example 12 | 0.11 | 6.5 | 33.1 | 30.1 | 14.5 |
| example 13 | 0.89 | 7.0 | 21.47 | 2.41 | 1.08 |
| example 14 | 14.73 | 11.0 | 17.01 | 0.11 | 0.03 |
| example 15 | 0.09 | 6.5 | 24.8 | 27.5 | 13.3 |

As above, under the same conditions excepting for the inorganic oxide interlayer, as compared to the OLED according to the comparative examples 1 to 4, the operating voltage of the OLED according to the examples 1 to 9 is considerably reduced and the efficiency thereof is increased. Also, as compared to the same operating voltage, the brightness is considerably increased.

Figure 3:
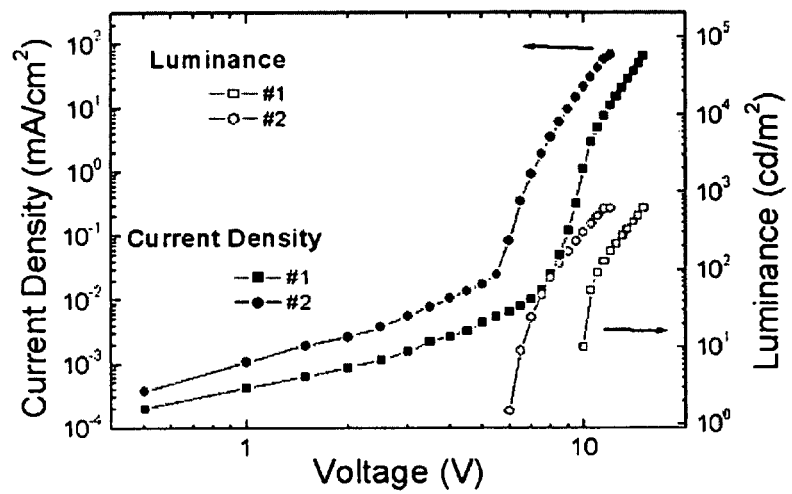
FIG. 3 is a graph showing the operating voltage and efficiency of an organic electroluminescent device according to the example 1 and the comparison example 1 of the present invention.
Figure 4:
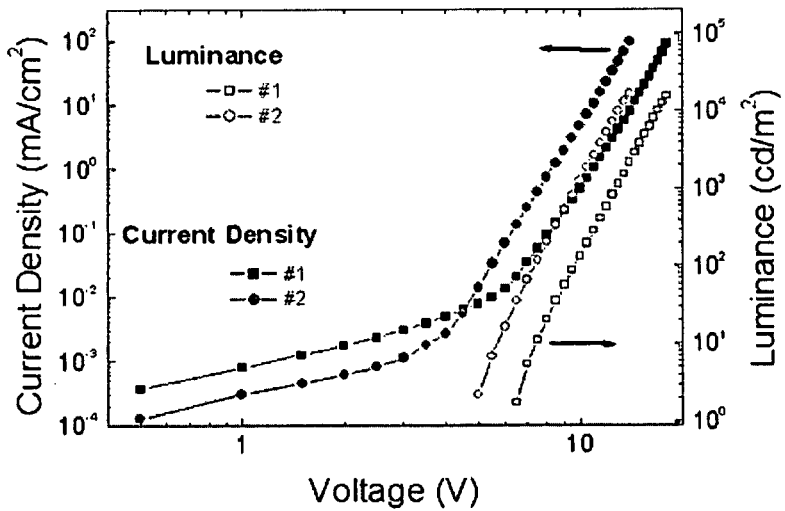
FIG. 4 is a graph showing the operating voltage and efficiency of an organic electroluminescent device according to the example 2 and the comparative example 2 of the present invention.
Figure 5:
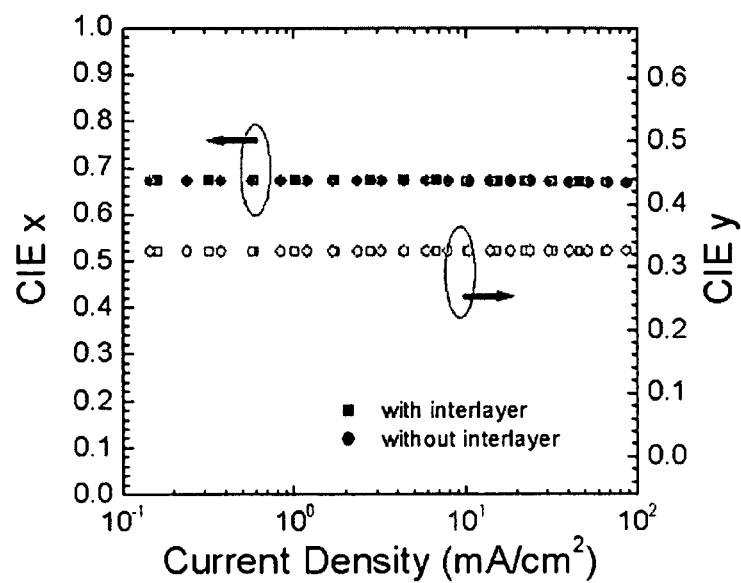
FIG. 5 is a graph showing a color coordinate of an organic electroluminescent device according to the example 9 and the comparative example 4 of the present invention.
Figure 6:
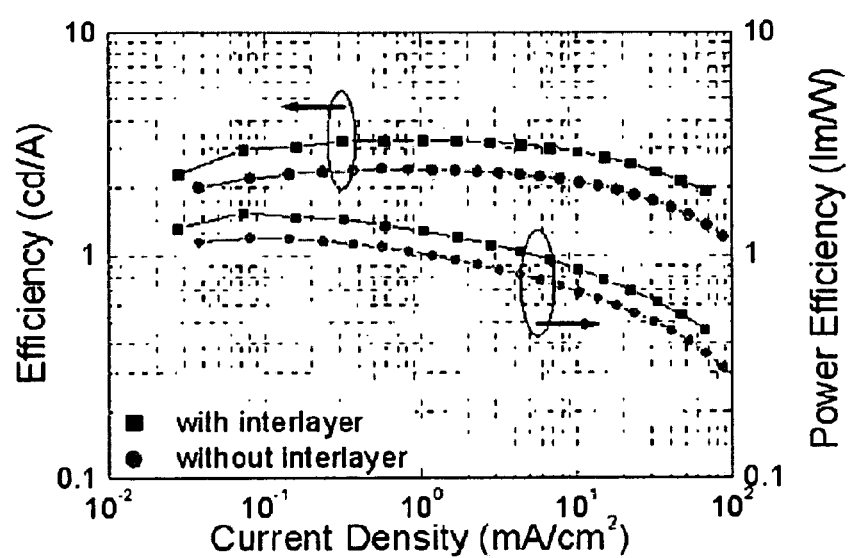
FIG. 6 is a graph showing the operating voltage and efficiency of an organic electroluminescent device according to the example 9 and the comparative example 4 of the present invention.

On the other hand, a graph comparing the operating voltage and efficiency of the OLED manufactured according to the example 1 and the comparative example 1 is shown in FIG. 3 and a graph comparing the operating voltage and efficiency of the OLED manufactured according to the example 2 and the comparative example 2 is shown in FIG. 4 (in FIGS. 3 and 4, a circle pattern relates to the example and a square pattern relates to the comparative example). A graph comparing a color coordinate of the OLED manufactured according to the example 9 and the comparative example 4 is shown in FIG. 5 and the operating voltage and efficiency thereof is shown in FIG. 6 (in FIGS. 5 and 6, a square pattern relates to the example and a circle pattern relates to the comparative example).

And, it can be appreciated from the table 1 that the efficiency of the OLED manufactured according to the examples 10 to 15 is considerably increased.

INDUSTRIAL APPLICABILITY

As above, with the present invention, reviewing the operating voltage and efficiency characteristics of an OLED device manufactured by inserting inorganic oxide interlayer configured of at least one layer in a light-emitting layer, the operating voltage is lowered and the efficiency is considerably increased. Also, according to the comparison result even in the same operating voltage, the brightness is considerably increased. Consequently, the OLED capable of improving its lifetime can be provided due to the reduction of operating voltage and the increase of efficiency.

The invention claimed is:

1. An organic electroluminescent device, comprising:
 an anode;
 a hole injection layer formed on an upper portion of the anode;
 a cathode disposed on the upper portion of the anode to be opposed to the anode;
 a hole blocking layer formed on a lower portion of the cathode;
 light-emitting organic material layers being formed between the hole injection layer and the hole blocking layer; and
 more than one inorganic oxide interlayer that is inserted between the light-emitting organic material layers,
 wherein each of the more than one inorganic oxide interlayer contacts only the light-emitting organic material layers, the hole injection layer contacts directly with the anode and the light-emitting organic material layer, and the hole blocking layer contacts directly with the cathode and the light-emitting organic material layer.

2. The device as set forth in claim 1, wherein at least two inorganic oxide interlayers are formed between the light-emitting organic material layers.

3. The device as set forth in claim 1, wherein each of the more than one inorganic oxide interlayer has a thickness of 0.1 to 500 nm.

4. The device as set forth in claim 1, wherein inorganic oxide includes oxide of Zr, Li, Na, K, Rb, Cs, Be, Mg, Ca, Sr, Ba, Ti, V, Mn, Fe, Co, Ni, Cu, Zn, Y, Nb, Mo, Ru, Rh, Pd, Ag, Cd, Hf, Ta, W, Re, Os, Ir, Pt, Au, Hg, Al, Ga, In, Tl, Ge, Sn, Pb, Sb, Bi, Si, As, Se, Eu, Sm, Th, Ac, Ce, or Pr, or at least one selected from complex oxide consisting of at least two of the elements.

5. The device as set forth in claim 4, wherein the inorganic oxide includes at least one selected from $ZrO_2$, $Li_2O$, $Na_2O$, $RbO_2$, BeO, CaO, SrO, BaO, $SiO_2$, TiO, $Ti_2O_3$, $TiO_2$, $V_2O_3$, $V_2O_4$, $V_2O_5$, $Mn_3O_4$, MnO, $Mn_2O_3$, $MnO_2$, FeO, $Fe_3O_4$, ZnO, $ZnO_2$, MgO, $SnO_2$, $In_2O_3$, $CrO_3$, CuO, $Cu_2O$, $HfO_2$, $Fe_2O_3$, CoO, $Co_3O_4$, NiO, $NiO_2$, $CeO_2$, $Y_2O_3$, NbO, $Nb_2$, $Nb_2O_5$, $MoO_2$, $MoO_3$, $RuO_2$, $Rh_2O_3$, $RhO_2$, PdO, AgO, $Ag_2O$, CdO, $Ta_2O_5$, $WO_3$, $WO_2$, $ReO_3$, $OsO_4$, $IrO_2$, $PtO_2$, $Au_2O_3$, HgO, $Ga_2O_3$, $GeO_2$, SnO, $PbO_2$, PbO, $PbO_4$, $Sb_2O_3$, $Sb_2O_4$, $Sb_2O_5$, $Bi_2O_3$, $As_2O_3$, $As_2O_5$, $SeO_2$, or $Eu_2O_3$.

6. The device as set forth in claim 4, wherein the complex oxide includes at least one selected from $ZrSiO_4$, $RbTiO_3$, $RbSeO_3$, $FeLiO_2$, $FeMoO_4$, $FeO_3Ti$, $Fe_2O_4Zn$, $Fe_2O_5Ti$, $Fe_5O_{12}Y_3$, $Fe_{12}O_{19}Sr$, $NiFeO_4$, $Nb_2O_6Pb$, $NbO_6Zn$, $MoO_4Pb$, $MoO_4Sr$, $MoO_4Zn$, AgOV, $AgO_4Re$, $Ag_2CrO_4$, $Ag_2O$, $Ag_2O_4W$, $CdO_3Zr$, $Ga_5Gd_3O_{12}$, $TiReO_4$, $PbSeO_3$, $PbTiO_3$, $PbZrO_3$, $Bi_2O_7Ti_2$, $Ce_2O_{12}W_3$.

7. A method of manufacturing an organic electroluminescent device, comprising:
 forming a hole injection layer on an anode;
 forming light-emitting organic material layers, each light-emitting organic material layer being formed on the hole injection layer;
 forming more than one inorganic oxide interlayer between the light-emitting organic material layers;
 forming a hole blocking layer on the light-emitting organic material layers; and
 forming a cathode on the hole blocking layer,
 wherein each of the more than one inorganic oxide interlayer contacts only the light-emitting organic material layers, the hole injection layer contacts directly with the anode and the light-emitting organic material layer, and the hole blocking layer contacts directly with the cathode and the light-emitting organic material layer.

8. The method as set forth in claim 7, wherein each of the more than one inorganic oxide interlayer is formed by a method selected from a spin coating, a roll coating, a spray coating, a dip coating, a flow coating, a doctor blade and dispensing, an inkjet printing, an offset printing, a screen printing, a pad printing, a gravure printing, a flexography printing, a stencil printing, an imprinting, a xerography, a lithography, a heat deposition, an electron beam deposition, an ion beam deposition, and a sputtering method.

* * * * *